United States Patent [19]

Okanobu

[11] 3,938,047
[45] Feb. 10, 1976

[54] CONTROL CIRCUIT FOR USE WITH AMPLIFIER
[75] Inventor: Taiwa Okanobu, Tokyo, Japan
[73] Assignee: Sony Corporation, Tokyo, Japan
[22] Filed: Apr. 25, 1974
[21] Appl. No.: 464,034

[30] Foreign Application Priority Data
May 1, 1973 Japan.............................. 48-52286

[52] U.S. Cl. ..................... 325/396; 330/29; 330/86
[51] Int. Cl.². .......................................... H04B 1/06
[58] Field of Search ........... 325/395, 396, 410, 478, 325/480; 178/DIG. 9; 304/309.1; 330/9, 16.29, 141, 96, 26, 28, 85, 97, 86–89, 110; 328/76, 77; 307/189, 140

[56] References Cited
UNITED STATES PATENTS

| 3,454,892 | 7/1969 | Knowles................................ 330/29 |
| 3,737,794 | 6/1973 | Kurz ....................................... 330/9 |
| 3,806,818 | 4/1974 | Uchiyama....................... 325/455 X |

*Primary Examiner*—Benedict V. Safourek
*Assistant Examiner*—Robert Hearn
*Attorney, Agent, or Firm*—Hill, Gross, Simpson, Van Santen, Steadman, Chiara & Simpson

[57] ABSTRACT

A control circuit for use with an amplifier is disclosed which includes an amplifier circuit having an input transistor, a driving transistor and an output transistor, a negative feedback circuit consisting of a parallel connection of a capacitor and a resistor and connected between the output terminal of the output transistor and the base of the driving transistor of the amplifier circuit. It also includes a transistor having its collector and emitter connected to the negative feedback circuit, a charging and discharging circuit connected to the base of the last mentioned transistor, and a voltage source connected to the charging and discharging circuit through a switch. The operation of the amplifier circuit is controlled by instantly making the switch on through the charging and discharging circuit and the transistor.

4 Claims, 1 Drawing Figure

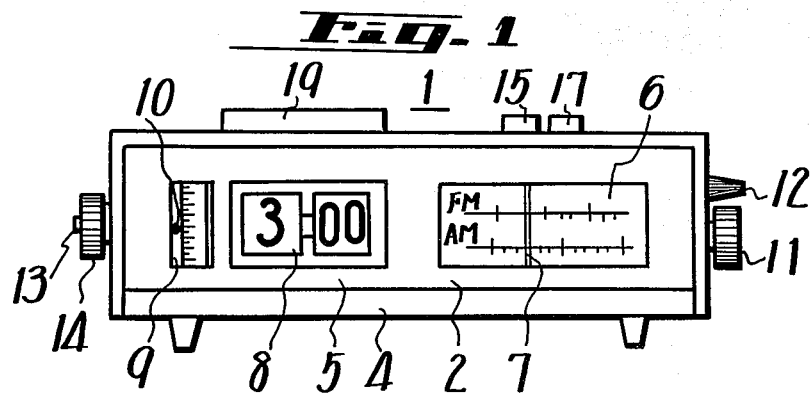
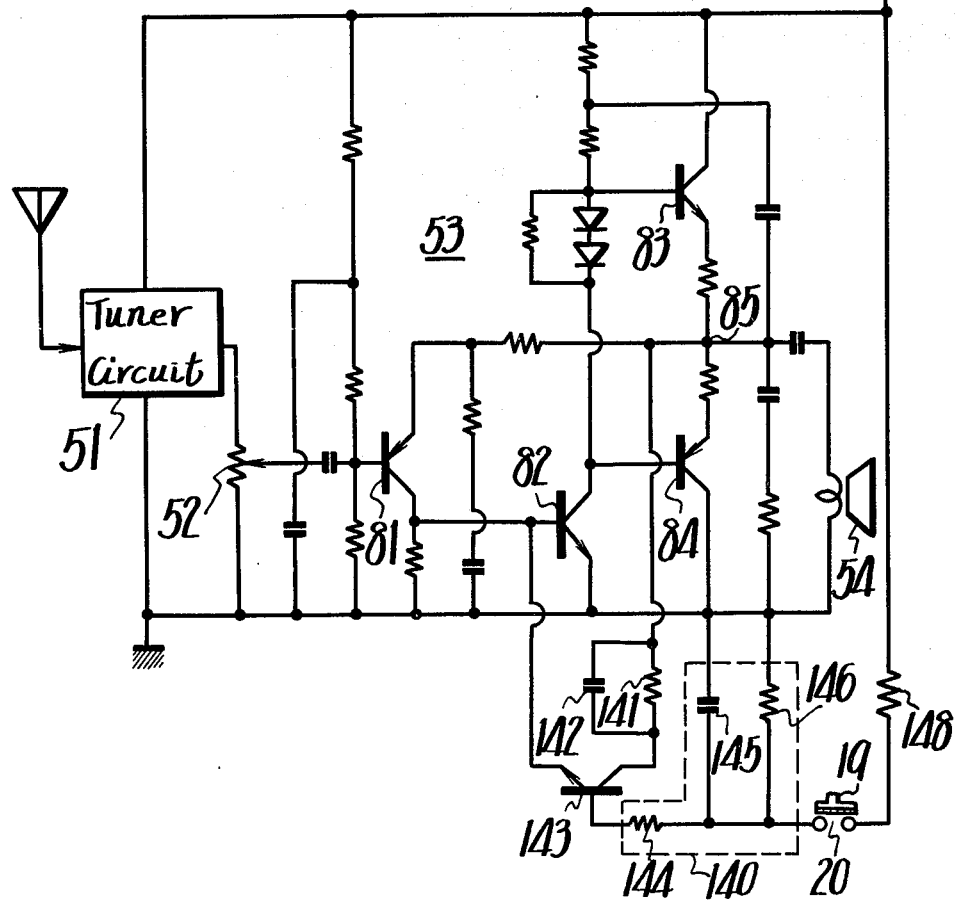

CONTROL CIRCUIT FOR USE WITH AMPLIFIER

BACKGROUND OF THE INVENTION

1. Field of the Invention

The present invention relates generally to a control circuit for use with an amplifier, and more particularly is directed to a control circuit for use with an amplifier in which even if the amplifier is made operative automatically by a time switch, the amplifier can be made inoperative by a switch, but the amplifier is made operative automatically after a certain time period.

2. Description of the Prior Art

A radio receiver with a timer has been known as an electronic instrument with a timer. With such a radio receiver, it reproduces a received broadcasting wave as a sound at a set time by the timer, or operates its oscillator to produce an alarm sound. Thus, a user can be aware of a predetermined time by the reproduced sound or alarm sound which is utilized, for example, for awakening.

A so-called snooze switch, which operates to stop reproduction of sounds or an alarm once, has also been provided in this kind of electronic instrument. However, even if a user pushes down the snooze switch once after he has awaked to stop the reproduction of sounds from the radio receiver, the radio receiver operates again to produce sounds after a certain time period (for example, about 10 minutes). Then, the user again pushes down the snooze switch to stop the reproduction of sounds from the radio receiver. The user repeats the above operation a number of times (for example, about one hour to ensure that he awakes positively). In practice, since in the prior art the snooze switch turns a power source line on and off, it requires a transistor for a power source switch and another transistor for setting a time which will mean that it requires a number of parts. Further, with the prior art when the radio receiver reproduces sounds after the snooze switch is pushed down, the reproduced sounds are distorted during the transient time period which are offensive.

SUMMARY OF THE INVENTION

A control circuit for use with an amplifier according to the present invention is provided with a snooze switch with which when a timer switch is turned on at a predetermined time by a time setting means to make the amplifier operative, the amplifier is made inoperative by pushing down the snooze switch. However, the amplifier is automatically made operative again after a certain time interval. Even if the snooze switch is pushed down to stop the operation of the amplifier, the amplifier can restore its operation automatically. The above operation is repeated a number of times.

Accordingly, it is an object of the present invention to provide a control circuit for use with an amplifier free from the drawbacks encountered in the prior art electronic instrument with a timer.

It is another object of the invention to provide a control circuit for use with an amplifier with which even if an electronic instrument is made operative by turning a time switch on, the operation of the electronic instrument is stopped by operating a snooze switch and the electronic instrument restores its operation after a certain time interval, and no distorted sound is reproduced. It is a further object of the invention to provide a novel control circuit for use with an amplifier which has a relatively small number of parts.

Other objects, features and advantages of the invention will become apparent from the following description taken in conjunction with the accompanying drawings.

BRIEF DESCRIPTION OF THE DRAWINGS

FIG. 1 is a front view of a radio receiver provided with a control circuit for use with an amplifier according to the present invention; and FIG. 2 is a circuit diagram of an embodiment of the control circuit for use with an amplifier according to the invention.

DESCRIPTION OF THE PREFERRED EMBODIMENT

An electronic instrument such as a radio receiver 1 shown in FIG. 1, which is provided with a control circuit for use with an amplifier according to the present invention, includes a time setting means to set a radio receiver 2 for reproducing a received broadcasting wave at a predetermined set time or to operate the oscillator of the radio receiver 2 so as to produce an alarm sound.

In FIG. 1, reference numeral 4 designates a housing of the electronic instrument 1; 5 its front panel; 6 a dial scale of the radio receiver 2; 7 a pointer of the dial scale 6; 8 a clock of the electronic instrument 1; 9 a time promise drum; and 10 its time indicator mark. The above mentioned elements can be viewed through windows formed in the front panel 5 of the housing 4.

Further, in FIG. 1, reference numeral 11 indicates a tuning dial knob of the radio receiver 2; 12 a volume adjusting knob of the radio receiver 2; 13 a time adjusting knob of the rotation of which the time indicator members of the clock 8 are sequentially rotated to change their indication and hence to adjust the time; 14 a time setting knob of the time setting means which is provided coaxially with the time adjusting knob 13 by the rotation of which the time promise drum 10 is rotated to change the promise time; 15 a push button of a push-and-push switch type which operates a change over switch of a set-reset switch (called as an auto button) of the time setting means, and which operates such that when the clock 8 arrives at the promise time by the time setting means, the timer switch goes on to make the radio receiver 2 operative to reproduce received braodcasting wave as a sound, or to generate an alarm sound, and if it is left as it is, the radio receiver 2 will be kept operative for a rather long time period, for example, one hour and thereafter the radio receiver 2 will stop its reproduction of sound; 17 a push button of a push-and-push switch type for operating a power switch of the radio receiver 2, which is called a manual button; and 19 an operating knob of a snooze push button of a self return switch type.

When the radio receiver 2 with the timer is used for awakening, for example, as an alarm clock, the timer switch is set such that the switch in association with the manual button 17 is turned off and the switch in association with the auto button 15 is put in setstate or on to the set the time promise indicator drum 9 at a promised time when the user awakes. Thus, the timer switch will be placed on at the promised time and the radio receiver 2 will produce sounds to cause the user to be awakened.

The foregoing is already known and hence its practical circuit construction and operation are omitted.

The control circuit for use with an amplifier according to the present invention will be now described, with reference to FIG. 2.

In FIG. 2, reference numeral 51 indicates a tuner circuit including a detector circuit and so on; 52 a potentiometer in association with the volume adjusting knob 12; 53 a low frequency amplifier; and 54 a loudspeaker. The low frequency amplifier 53 includes an input transistor 81, a driving transistor 82 and a pair of output transistors 83 and 84, respectively. These transistors 81-84 are direct coupled and the output transistors 83 and 84 are connected in the manner of a single ended push-pull (SEPP).

Further, in FIG. 2, reference numeral 55 indicates a voltage source terminal of +Vcc; 18 a power source changing switch in association with the manual button 17; 16 a changing switch for set and reset of the time setting means 3 in association with the auto button 15; 8 a clock; and 31 a timer switch in association with the clock 8. In this case, the time setting means 3 consists of the clock 8, the promise time indicator drum 9, the timer switch 31 and the changing switch 16, respectively.

With the present invention, the output terminal of the amplifier 53 or the common connection point 85 between the emitters of the transistors 83 and 84 is connected to the base of the transistor 82 through a parallel connection of a resistor 141 and a capacitor 142 and through the collector-emitter of a transistor 143 to form a negative feedback circuit. While, the base of the transistor 143 is grounded through a resistor 144 and a capacitor 145 of a charging and discharging circuit 140. The circuit 140 includes a resistor 146 connected in parallel to the capacitor 145 for discharging. The connection point among the resistors 144, 146 and capacitor 145 is connected to the switches 16 and 18 through a switch 20 and a resistor 148. The switch 20 is a self-return type one so that, during the time interval when the snooze button 19 is kept pushed down, the switch 20 is on.

With such a construction, if the electronic instrument is used as an ordinary radio receiver for hearing the broadcast wave, it is sufficient to have the switch 18 on. That is, if the switch 18 is on, power is supplied therethrough to the tuner circuit 41 and the amplifier 53. At this time, the switch 20 is turned off and the transistor 143 is also nonconductive, so that the amplifier 53 operates to reproduce the broadcasting wave through the loudspeaker 54.

If the instrument is desired to be used for awakening, the switch 18 is turned off but the switch 16 is turned on. Thus, when the set time comes, the timer switch 31 is turned on, so that power is supplied through the closed switches 31 and 16 to the tuner circuit 51 and the amplifier 53 and hence the broadcasting wave is reproduced through the loudspeaker 54 to awaken the user. At this time, if the reproduction of the broadcasting wave is desired to be stopped, it is sufficient to put the switch 20 on. That is, if the switch 20 is put on, the capacitor 145 is charged rapidly through the resistor 148 and the switch 20 to put the transistor 143 into a conductive state by its charging current. As a result, the DC negative feedback and AC negative feedback are applied from the connection point 85 to the base of the transistor 82 through the resistor 141, the capacitor 142 and the transistor 143 to lower the gain of the amplifier 53, and the voltage at the connection point 85 is lowered due to the conduction of the transistor 143, and hence the transistor 81 is made nonconductive. As a result, if the switch 20 is put on, the reproduction of the broadcasting wave through the loudspeaker 54 is stopped at once. In this case, by the provision of the resistor 141 the voltage at the connection point 85 is selected such that it is not so much lowered from ½ Vcc (the voltage of the voltage source 55).

However, if the switch 20 is turned off, the charge stored in the capacitor 145 is discharged through the resistors 144 and 146, and the transistor 143 becomes nonconductive after a time period determined by its discharging time constant, for example, 5 to 10 minutes. When the transistor 143 is made nonconductive, no negative feedback is applied to the base of the transistor 82, so that the gain of the amplifier 53 is restored and the transistor 81 becomes conductive to reproduce the broadcasting wave through the loudspeaker 54 again.

In this case, since the bias voltage of the transistor 81 gradually changes when the transistor 81 is changed from its off-to on-state, the output from the transistor 81 is distorted. However, since negative feedback is applied to the following stage transistors 82 and 84 due to the resistor 141 and the capacitor 142 to lower their gain, the distorted output from the transistor 81 is prevented from being applied to the loudspeaker 54. As a result, when the alarm is sounded again no distortion occurs in the sounded alarm. Further, the voltage at the connection point 85 is always kept substantially at ½ Vcc, so that when the alarm is sounded again, no distortion is heard even if the alarm is high in magnitude.

With the present invention, when the alarm sound which is stopped once is produced again, it is prevented from being distorted and the circuit construction therefor is very simple.

The above description is given on only one preferred embodiment of the invention, but it may be apparent that many modifications and variations could be effected by those skilled in the art without departing from the spirit and scope of the novel concepts of the invention.

I claim as my invention:

1. A control circuit for use with an amplifier comprising: a signal source for producing a signal; an amplifier circuit consisting of an input transistor which receives said signal from said signal source on its control electrode, a driving transistor with its control electrode connected to an output electrode of said input transistor, and a power amplifying transistor with its control electrode connected to an output electrode of said driving transistor;

an output means connected to the output electrode of said power amplifying transistor;

a switching transistor with its output electrode connected to the control electrode of said driving transistor;

a negative feedback circuit connected between the output electrode of said power amplifying transistor and an input electrode of said switching transistor, said negative feedback circuit including a capacitor and a resistor connected in parallel with each other;

a voltage source for applying a voltage to said amplifier circuit;

a charging and discharging circuit connected between ground and the control electrode of said switching transistor, and a momentary switch means connected between said voltage source and said charging and discharging circuit such that when said switch is means momentarily closed said charging and discharging circuit charges which causes said switching transistor to conduct and supply negative feedback to said driving transistor to turn it off and when said switch opens after closing said charging and discharging circuit discharges for a period of time after which said switching transistor is turned off which turns said driving transistor on to supply power to said output means.

2. A control circuit for use with an amplifier as claimed in claim 1, wherein said signal source includes a circuit which converts a radio frequency signal to an audio frequency signal, and wherein said output means is a loudspeaker which converts said audio frequency signal to sound.

3. A control circuit for use with an amplifier as claimed in claim 1, which further comprises a timer, a first power source switch, a timer switch in series with said first power source switch and the combination connected between said voltage source and said momentary switch means, and said timer switch being controlled by said timer at a predetermined time.

4. A control circuit for use with an amplifier as claimed in claim 3, which further comprises a second power switch connected in parallel with said first power switch and said timer switch.

* * * * *